(12) United States Patent
Albelo et al.

(10) Patent No.: US 12,660,546 B1
(45) Date of Patent: Jun. 16, 2026

(54) SEMICONDUCTOR COATER FLUID TRANSFER DEVICE AND METHOD OF USE

(71) Applicant: Nanoverse Technologies Ltd, Beaverton, OR (US)

(72) Inventors: Jeff Albelo, Beaverton, OR (US); William Robertson, Beaverton, OR (US)

( * ) Notice: Subject to any disclaimer, the term of this patent is extended or adjusted under 35 U.S.C. 154(b) by 0 days.

(21) Appl. No.: 19/088,081

(22) Filed: Mar. 24, 2025

(51) Int. Cl.
*H10P 72/00* (2026.01)

(52) U.S. Cl.
CPC .................................. *H10P 72/0402* (2026.01)

(58) Field of Classification Search
CPC ....................................................... H10P 72/0402
See application file for complete search history.

(56) References Cited

U.S. PATENT DOCUMENTS

| | | | | |
|---|---|---|---|---|
| 4,922,721 A | * | 5/1990 | Robertson | F25B 21/02 62/3.61 |
| 2006/0065144 A1 | * | 3/2006 | DeMoore | B41F 23/08 101/424.2 |
| 2022/0118470 A1 | * | 4/2022 | Mills | B05B 15/25 |
| 2022/0203007 A1 | * | 6/2022 | Yuds | A61M 1/28 |

* cited by examiner

*Primary Examiner* — Nathan T Leong
(74) *Attorney, Agent, or Firm* — Mark S Hubert

(57) ABSTRACT

A semiconductor coater fluid transfer system that provides an uninterrupted coater fluid supply to the coater module as well as provides data about the coater fluid from the coater fluid fill vessel, the coater fluid cart's leak detector sensor and the coater fluid carboy's sensors (level or chemical such as conductivity, pH etc.) to the coater module's workstation computer via the coater fluid docking station. The complete coater fluid and data transfer methodology involves the use of the coater cart to extract fluid and data from the onsite coater fluid bulk storage container and transfer it to the coater module's fluid and data transfer docking station.

7 Claims, 10 Drawing Sheets

FIG.6
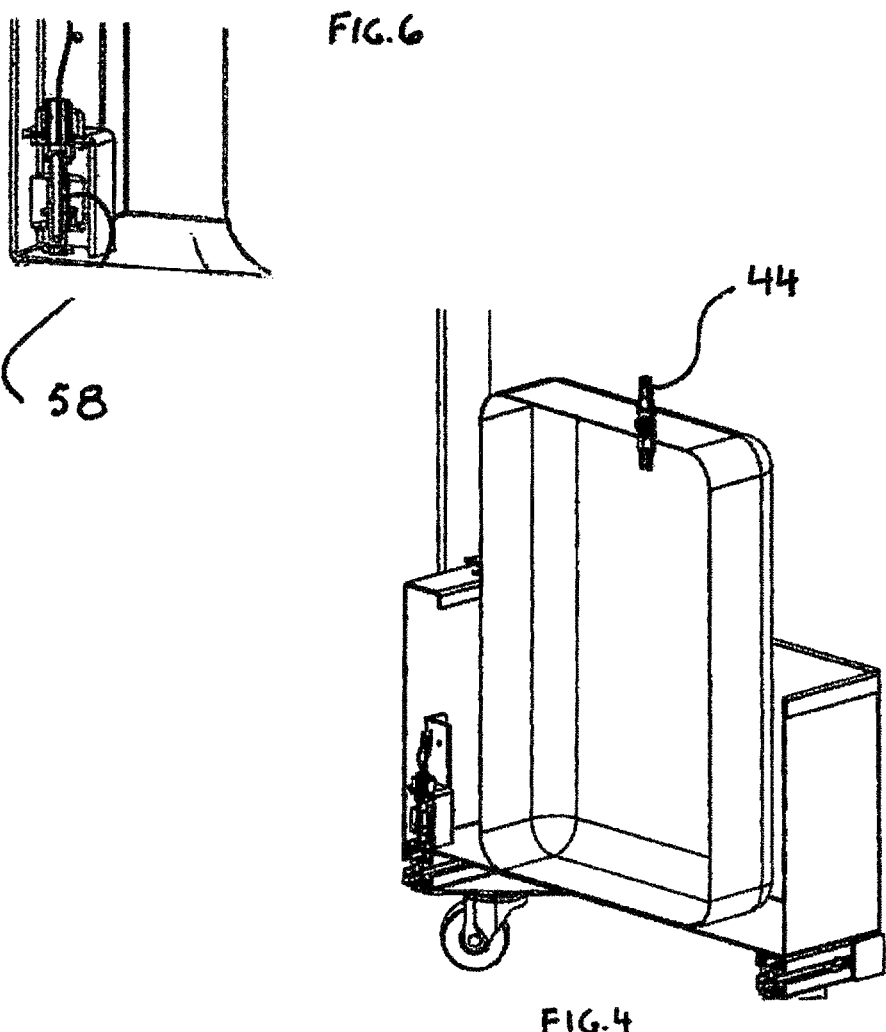
58
44
FIG.4
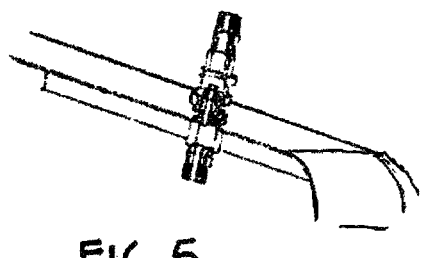
FIG.5

50

50

SEMICONDUCTOR COATER FLUID TRANSFER DEVICE AND METHOD OF USE

COPYRIGHT STATEMENT

FIELD

The present disclosure relates, in general, to semiconductor processing, and more particularly to the surface coating technology of the Si wafers during the semiconductor fabrication.

BACKGROUND

One of the steps in the transformation of a Si disk (wafer) to a set of semiconductor chips is the spray application of a group of specially formulated liquid coater fluids onto the surface of the Si wafer by a pneumatic sprayer in an encapsulated coater module, to put a chemical film onto the Si wafer prior to laser scribing. This surface film imparts specific characteristics necessary for the laser scribing of that Si wafer.

Traditionally, at the facility, the incoming coater fluid is transferred from the supplier's vessel to a facility bulk storage vessel. Thereafter, the coater fluid is manually transferred from this bulk storage vessel to a portable carboy that resides atop a weight scale located on a rollable cart assembly ("coater cart"). The carboy's coater fluid level measurement is only available when the carboy is in the coater cart and on the scale. Carboy inventory levels are unavailable. The data about the coater fluid coming from the supplier, is provided via written shipping manifest documents. There is no automation for the transfer of data about the coater's chemistry or origin, to the facility host computer or facility module workstation computers, nor is there any mechanism that links the coater fluid data to the actual coater fluid. There is no automation for the correct (safe) amount of coater put into the carboy. There is no visible indication of the coater fluid level in the carboy. There is no leak detection system on the coater cart. The cart must be manually pushed to the coater module. Existing coater modules accommodate storage area for only one coater cart and carboy. If different coater fluids are needed, the lines from the carboy to the spray head must be flushed out manually to avoid cross contamination. There is only one coater cart connectable to a coater module at a time, necessitating the interruption of semiconductor production when the coater fluid runs low. There is no data logging of fluid levels used vs production output.

Henceforth, a system of safely acquiring and transferring coater fluid and coater fluid data from bulk storage to a coater module for the continual spray coating of Si wafers and coater fluid data transfer to the facility host computer, would increase the throughput of the workflow process in the semiconductor processing industry. This invention utilizes and combines known and new technologies in a unique and novel configuration to overcome the aforementioned problems and accomplish this.

BRIEF SUMMARY

In accordance with various embodiments, a device (hereinafter "coater cart") for providing coater fluid and coater fluid identifying data to the computer in a semiconductor fabrication facility's coater module, is provided.

In one aspect, a coater module's coater fluid and data docking station, that accepts more than one coater cart simultaneously and can accept, process and transfer data about the coater fluid, is provided.

In one aspect, a coater module fluid transfer system that allows for an uninterruptable supply of coater fluid to the coater module to enable continuous spray coating of Si wafers.

In another aspect, a coater fluid purge system that can purge its two coater fluid feed lines to allow uncontaminated use of various coater fluids.

Various modifications and additions can be made to the embodiments discussed without departing from the scope of the invention. For example, while the embodiments described above refer to features, the scope of this invention also includes embodiments having different combination of features and embodiments that do not include all the above-described features.

BRIEF DESCRIPTION OF THE DRAWINGS

A further understanding of the nature and advantages of embodiments may be realized by reference to the remaining portions of the specification and the drawings, in which like reference numerals are used to refer to similar components.

FIG. 4 is a perspective rear cross-sectional view of a coater cart;

FIG. 5 is a perspective rear cross-sectional view of the level sensor:

FIG. 6 is a perspective rear cross-sectional view of the leak detector;

DETAILED DESCRIPTION OF CERTAIN EMBODIMENTS

Figure 1:
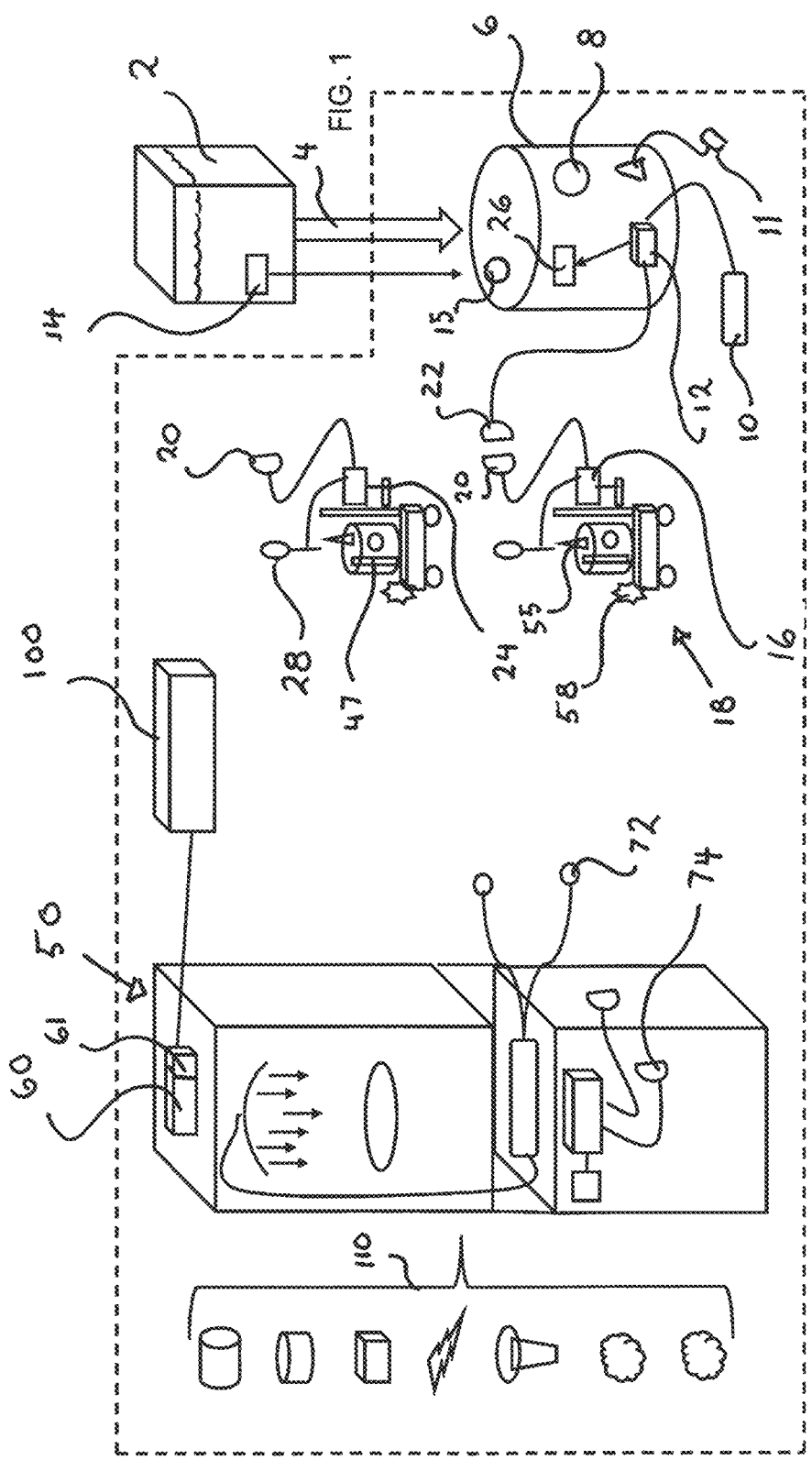
FIG. 1 is a diagrammatic representation of the semiconductor coater fluid transfer system.
Figure 2:
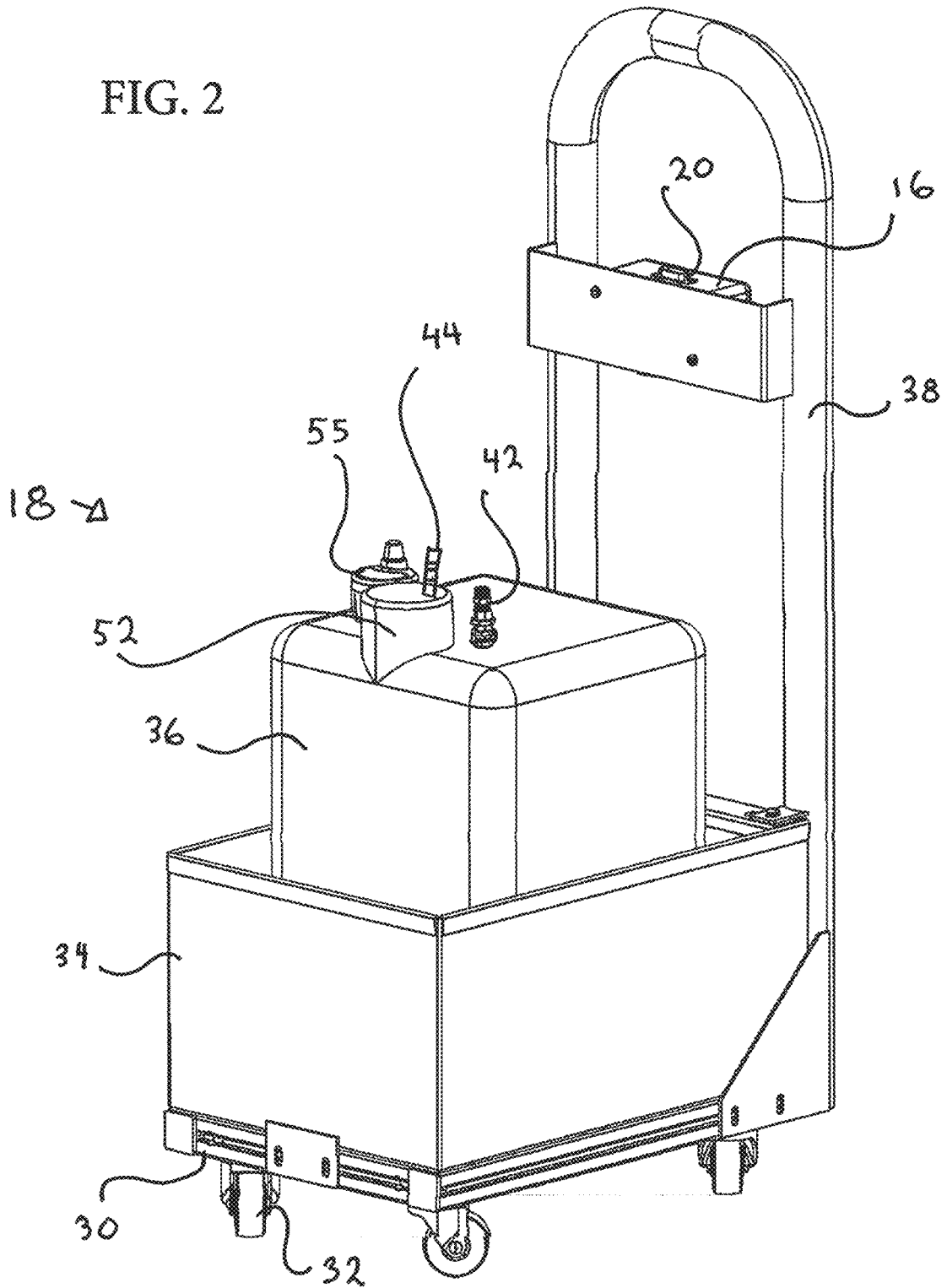
FIG. 2 is a perspective front view of a coater cart.
Figure 3:
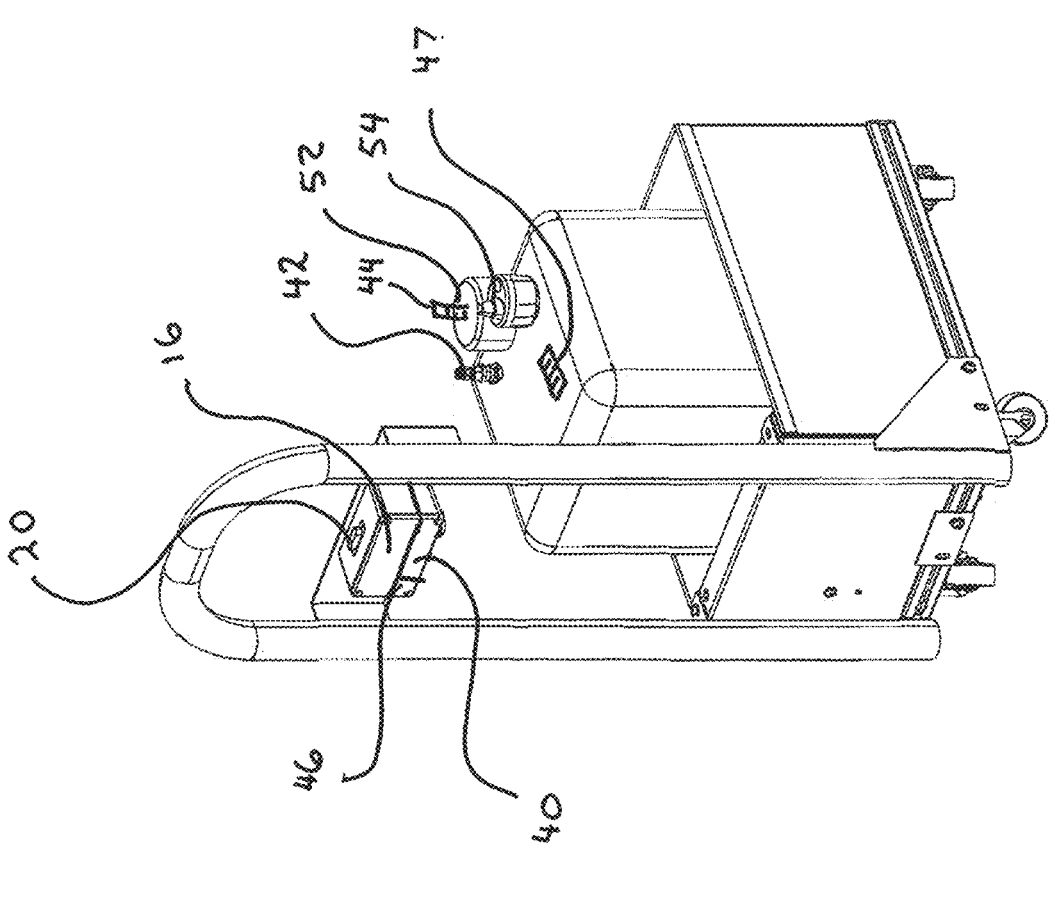
FIG. 3 is a perspective rear view of a coater cart.

Reference will now be made in detail to embodiments of the inventive concept, examples of which are illustrated in the accompanying drawings. The accompanying drawings are not necessarily drawn to scale. The described examples are provided for illustrative purposes and are not intended to limit the scope of the invention.

It will be understood that, although the terms first, second, etc. may be used herein to describe various elements, these elements should not be limited by these terms. These terms are only used to distinguish one element from another. For example, a first attachment could be termed a second attachment, and, similarly, a second attachment could be termed a first attachment, without departing from the scope of the inventive concept.

It will be understood that when an element or layer is referred to as being "on," "coupled to," or "connected to" another element or layer, it can be directly on, directly coupled to or directly connected to the other element, or intervening elements or layers may be present. In contrast, when an element is referred to as being "directly on," "directly coupled to," or "directly connected to" another element, there are no intervening elements present.

As used in the description of the inventive concept and the appended claims, the singular forms "a," "an," and "the" are intended to include the plural forms as well, unless the context clearly indicates otherwise. It will also be understood that the term "and/or" as used herein refers to and encompasses all possible combinations of one or more of the associated listed items.

As used herein, the term "computer" refers to any form of electronic device for receiving, storing, processing, and sharing data, typically in binary/digital form, according to instructions given to it in a program, variable or not. With this data it can perform prescribed mathematical and logical operations at high speed. The data may be visually displayed or may be sent to another electronic device for the physical performance of a task by electromechanical equipment (such as a robotic device, or sequenced starting/stopping/running of equipment.) These other electronic devices include computers, embedded computers, microcontrollers, microprocessors, programable logic controllers, programmable or non-programmable logic devices or arrays, application specific integrated circuits (ASICs), smart cards, and the like. In its simplest definition, as used herein with reference to the above discussed equipment, a computer is a device that accepts information (in the form of digitalized data) and manipulates it to accomplish some result based on a software algorithm or sequence of instructions on how the data is to be processed to accomplish the result.

As used herein the term "SEMI standard" refers to a set of international standards and specifications that govern all the safety, materials, equipment, facilities, software, hardware, structures and packaging standards, in a semiconductor fabrication facility. It has been established and codified by the Semiconductor Equipment and Materials Initiative.

As used herein, the term "coater fluid and coating fluid" are used interchangeably and represent the same thing.

As used herein, the term "coater fluid bulk storage vessel" refers to the vessel proper as well as all of the fluid and data transfer equipment located at the vessel including the computer, hard wire cables, optical scanners, wireless communication devices, fluid transfer hoses, and the like.

Semiconductor production facilities have a series of semiconductor fabrication and metrology modules, that are stand-alone or integrated into a composite module. Each module performs one or some of the sequential tasks required to make a Si wafer into a semiconductor device. The Si wafers are transported between modules in boxed vertical arrays of 25 or 14 wafers known as FOUPS. These FOUPS are precisely connectable to an equipment front end module (EFEM) that facilitates the transfer of the Si wafers individually through a loading/transfer port into the module or composite module the EFEM is attached to. The Si wafers are transferred individually to and from the FOUP through a transfer port in the EFEM by a robotic arm that appropriately and precisely places the wafer on or off the equipment in the module/s. The FOUPS are moved between the EFEMs of the various modules by a robotic overhead transfer system.

The semiconductor production facility has a host facility computer that controls the overall semiconductor fabrication process. It directs the operation of the computers that control the FOUP delivery system, the EFEM computers and each of the production module computers that in turn, run the module's electro-mechanical tools through a system of microcomputers, PLC's microcontrollers and microprocessors. The FOUPS are delivered between the EFEMs of the various modules by an overhead robotic transfer system. The modules are connected to the necessary facility's utilities, including, but not limited to water, electricity, vacuum, fluid drains, HVAC, compressed air and compressed specialty gases ($N_2$ Ar, $CO_2$ etc.).

One of the modules in a semiconductor fabrication facility is a coater module. This module receives a coater fluid that is dispensed onto a Si wafer prior to laser scribing that occurs later, in another module. The present invention relates to a novel design of two devices that supply of both coater fluid and coater fluid data to a coater module that spray coats Si wafers destined to become integrated circuit chips or components in a semiconductor fabrication facility. It involves two novel devices, a coater cart and a coater module (fluid and data) docking station, that is integrated within the coater module. This system is designed for integration with future technologies that will eventually merge with the complete AI automation of the wafer coating process.

Prior art existing coater modules receive their coater fluid from a single carboy that sits atop a weight scale on a rolling cart. Only one rolling cart can be spatially accommodated by the coater module at a time. Only one carboy of coater fluid can be fluidically coupled to the coater module at a time. The coater module is thus unable to simultaneously support two different types of coater fluid. The carboy receives coater fluid from an onsite bulk storage vessel that was manually filled from the supplier's delivery truck. When filled, the cart transported to the coater module, slid underneath and fluidically coupled to the coater module (at its docking station) after the previous, empty carboy is disconnected and removed and the coater process is interrupted. The only visible indication of the level of coater fluid in the carboy is the readout of the weight scale. Only one carboy at a time is connectable to a coater module docking station. When the carboy empties, the coater process must be temporarily paused until a new carboy is connected. However, of specific concern is that the prior art coater cart has no transfer mechanism for the following data about coater fluid it contains:

The manufacturer of the coater fluid,
The specific chemistry of the coater fluid,
The manufacturer's batch identification of that coater fluid,
The date of the receipt/transfer of the coater fluid,
The amount of coater fluid in the carboy,
The rate of usage of coater fluid,
Any coater fluid solution specific information such as MSDS, and
Any specific chemical properties of the coater fluid that can be determined by sensors in the carboy or onsite bulk storage vessel (carboy level, conductivity, temperature, etc.)

This lack of data and interruptible supply of coater fluid is of great concern in the semiconductor fabrication industry as it is another bottleneck in the overall process efficiency.

This semiconductor coater fluid transfer system overcomes the prior art's aforementioned drawbacks and deficiencies. It focuses on a coater fluid transfer system that provides an uninterrupted coater fluid supply to the coater module as well as provides data about the coater fluid obtained digitally from the coater fluid fill vessel, the coater fluid cart's leak detector sensor and the coater fluid carboy's level sensor to the coater stations workstation computer. The complete semiconductor coater fluid transfer system is illustrated in FIG. 1 and is comprised of two devices—the coater cart and the coater module (fluid and data) docking station 60.

With reference to FIGS. 2-6 the coater cart 18, its design and function can best be discussed. The coater cart 18 is a generally planar base 30 riding atop a plurality of rollable, pivotable wheels 32. There is a walled frame 34 affixed to the side or top face planar base 30 that houses a sealable carboy 36 therein. Affixed to the base 30 or the frame 34 is a hollow handle 38 for pushing or pulling the cart 18 about. The handle 38 may be a linear member or it may have a loop configuration as illustrated. Electric and electronic wiring is routed through the handle 38 to prevent snagging. In future embodiments, the handle 38 may be eliminated in lieu of motorization. There is a coater cart computer 16 affixed to the cart 18, preferably on the handle 38. The computer 16 has an electronic connector 20 thereon for connection with mating compatible electronic connectors at the coater module 50, and at the onsite bulk storage vessel 6.

The coater cart computer 16 has a wireless communication device 24 for communication with the coater module's workstation computer 62 and the bulk storage vessel's computer 12 or via its wireless communication device 26. The cart 18 has a rechargeable power source 40 for the operation of the computer 16, the cart leak detection system 58, the carboy level sensor 44, the carboy level indicator 47 and the optical scanning device 28. The power source 40 has a charging circuit 46 built in that draws power through the electronic connector 20 when the cart 18 is coupled to the coater module 50.

There is a sealed dome 52 that projects from the top of the carboy. This houses the level sensor 44 and prevents it from contamination. The sensor is in communication (wireless or hard wired) with the coater cart computer 16 and provides it a continual signal of the coater fluid level in the carboy. The level sensor 44 is chosen from the set of level sensors including optical, ultrasonic, ultrasound, radar, resistive, conductivity, or submersible. The preferred embodiment is a radar sensor. In an alternate embodiment there may be a two-way flow sensor utilized, providing data of coater fluid in vs coater fluid out.

There is also an off-gas vent 42 extending from the top face 65 of the carboy that is used in the hydraulic, pneumatic or motorized pumping of coater fluid to the coater module 50. The pumping transfer of coater fluid to the coater module 50 occurs through the transfer connector 55. There is a visual carboy level indicator 47 mounted on the top face 65 of the carboy. Preferably this will be an escalating set of LEDs. Its signal may come from the cart computer 16 or from its own, separate level sensor.

Figure 7:
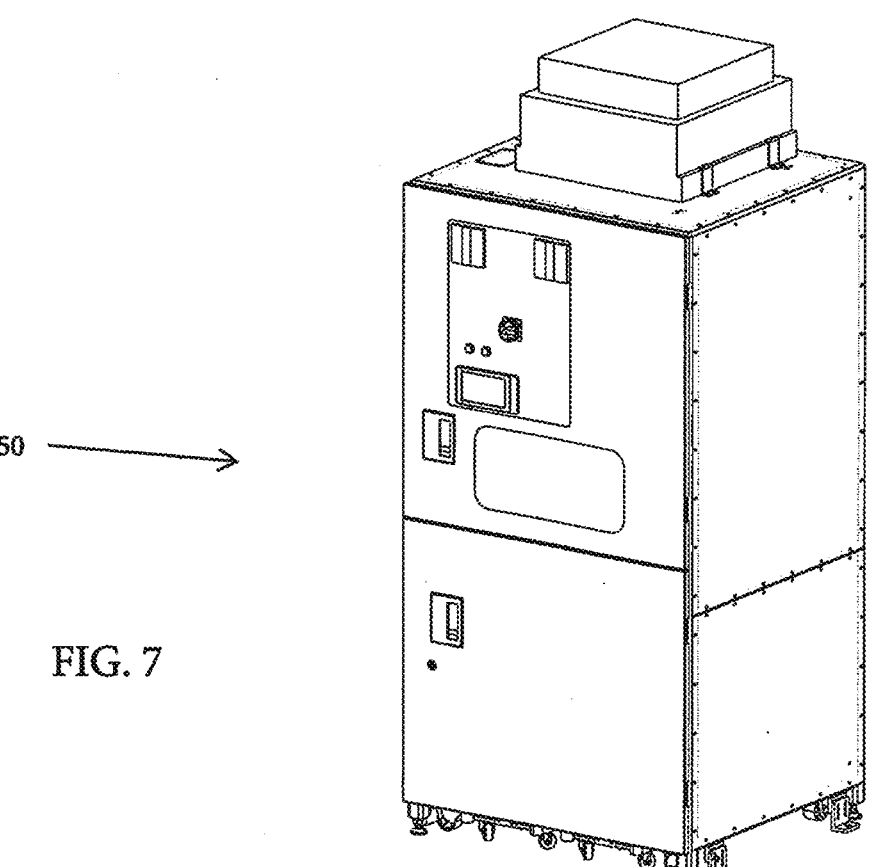
FIG. 7 is a perspective right-side view of the coater module.
Figure 8:
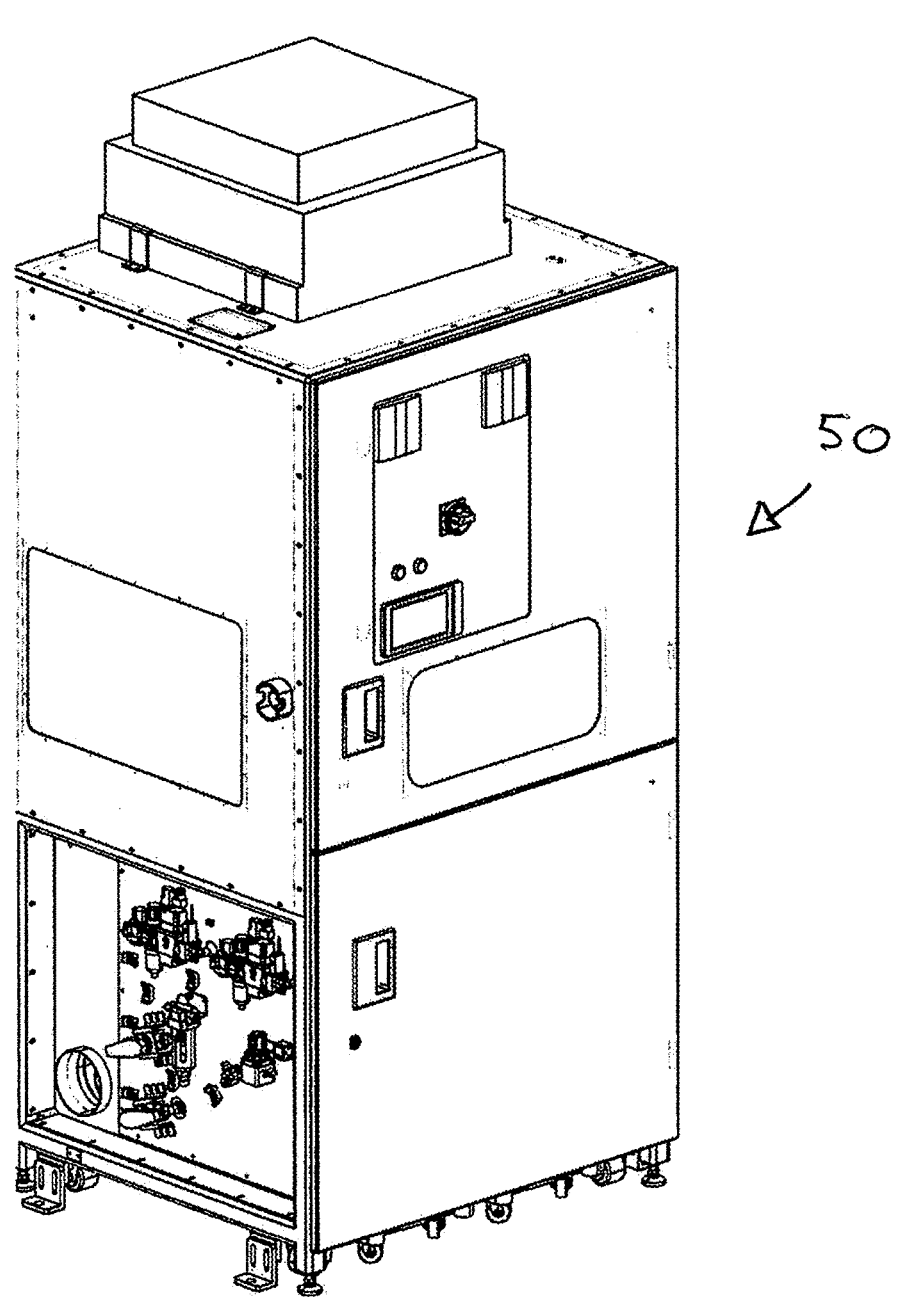
FIG. 8 is a perspective left-side view of the coater module.
Figure 9:
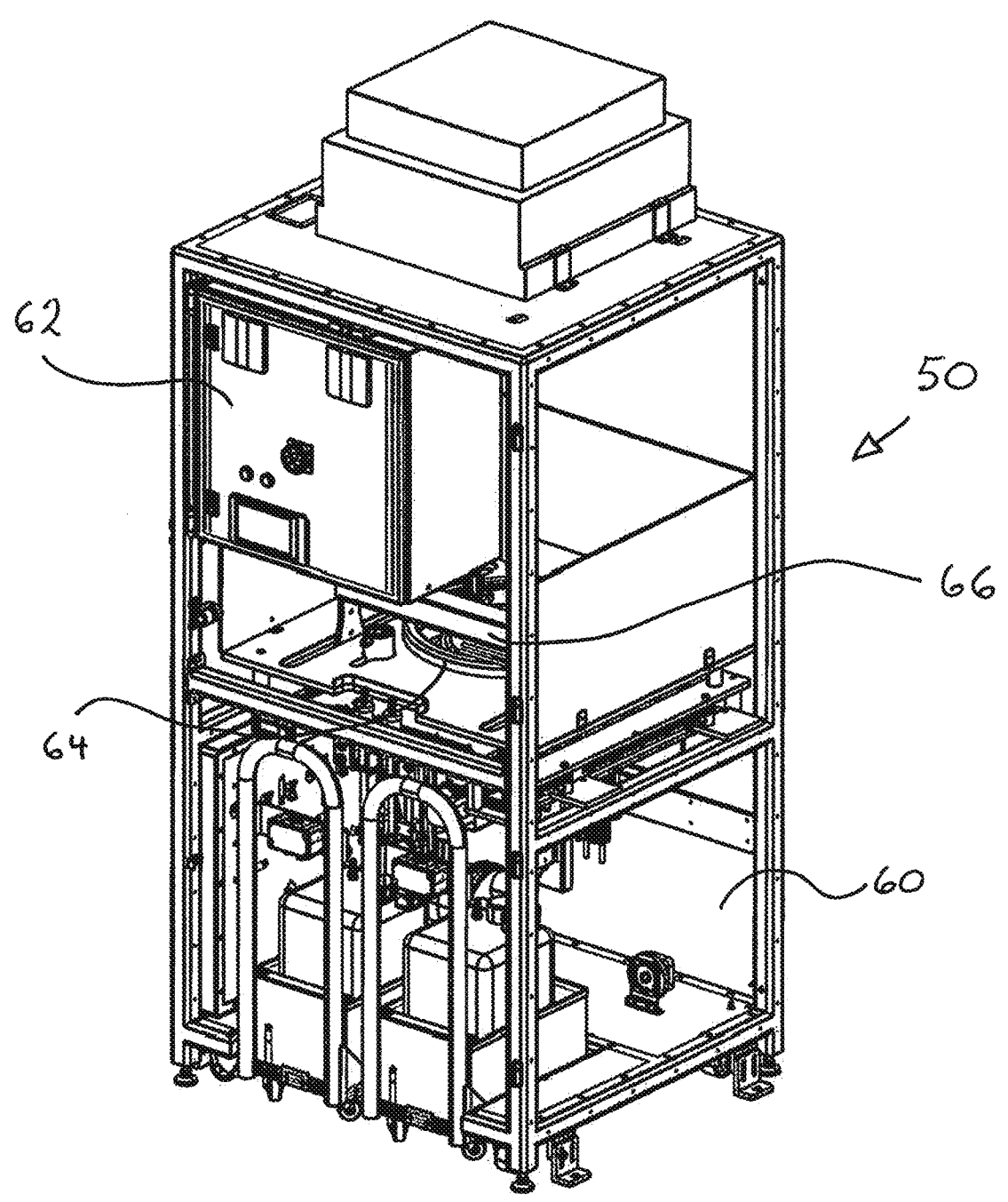
FIG. 9 is a perspective right-side view of the coater module with its side panels removed for clarity.
Figure 10:
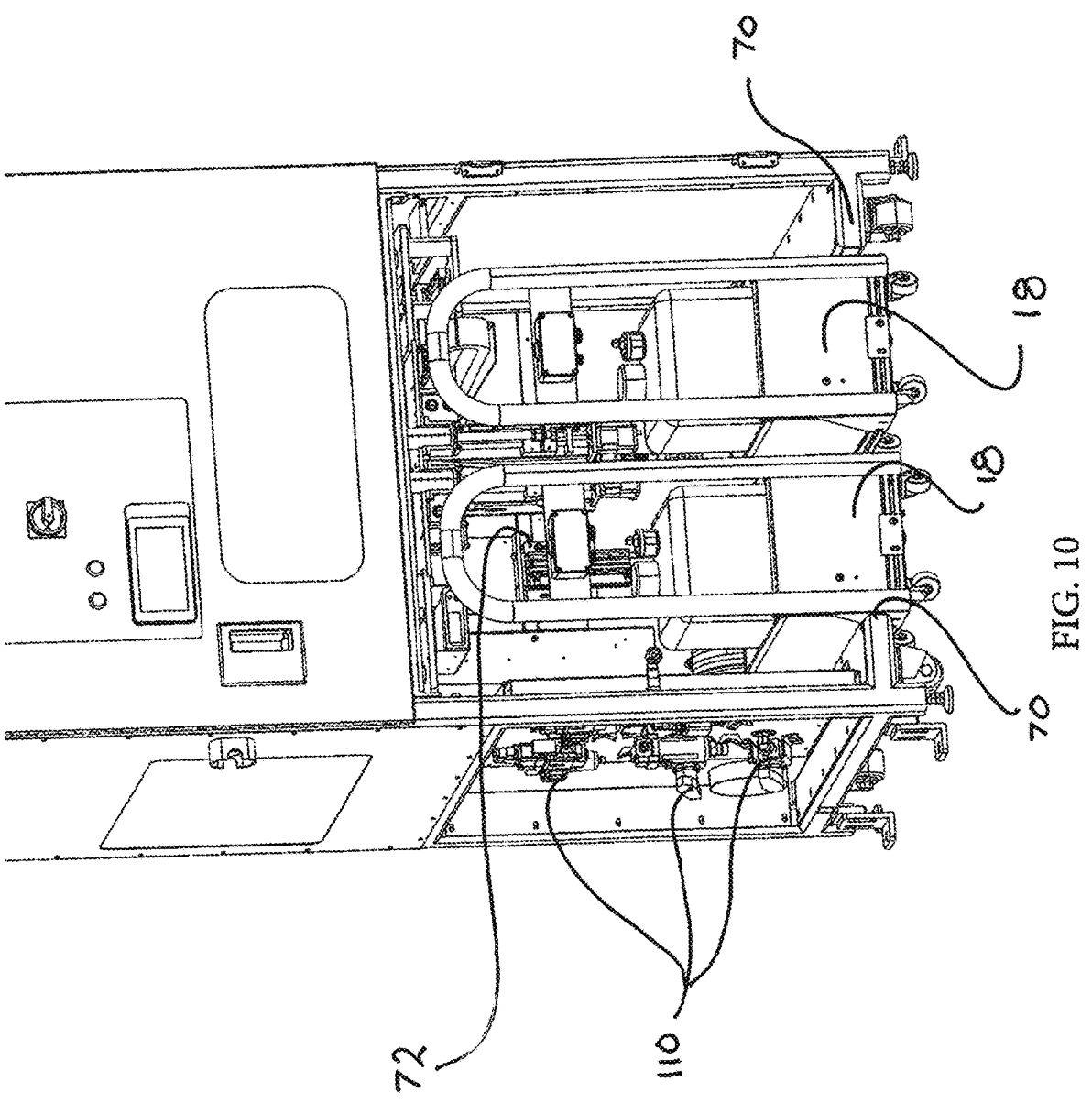
FIG. 10 is a perspective front view of the coater module (fluid and data) docking station.

FIGS. 7-9 show the coater module 50 from various angles and with side panels removed. The coater module docking 60 is located beneath and integrated with the coater module 50. The coater module 50 is a rigid enclosure, built to the exacting tolerances of the applicable SEMI standard. It has a module workstation computer 62 that receives prompts from, and shares data with the facility host computer 100. The module workstation computer 62 directs the various electronic devices that operate the electromechanical equipment in the coater module.

Inside the coater module 50 is a rotatable, motor driven chuck 64 that holds a Si wafer thereon its top planar surface. Above the chuck 64 is a coater spray unit 66 that pneumatically, hydraulicly or electrostatically deposits coater fluid onto a Si platter. The coater fluid is pumped from the carboys on the coater cart docked at the docking station 60 to the coater spray unit 66.

Each coater module 50 is operatively connected to facility utilities 110 such as water, compressed air, vacuum, drains, gases ($N_2$, $O_2$, Ar, $CO_2$), electricity, computer connection cables, and the like.

Figure 11:
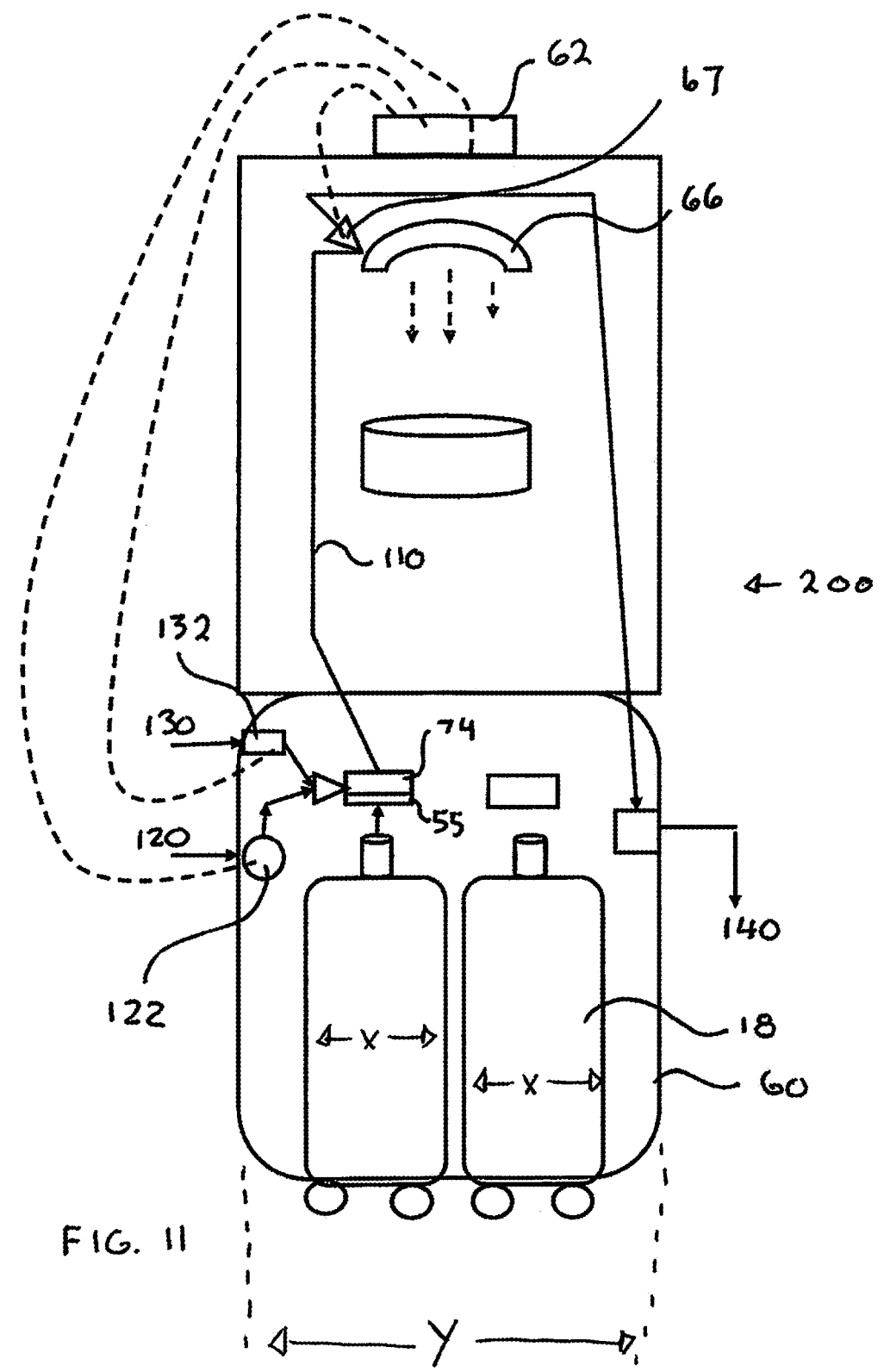
FIG. 11 is a diagrammatic representation of the line purge system.

The docking station 60 is located directly below the coater spray unit 66. There is a set of guide bumpers 70 that contact at least two sides of the walled frames 34 of the coater carts 16 to aid in aligning the docking of the two coater carts 18 under the spray unit. The coater carts 18 have a width and length that allows two of them to fit side by side under the footprint of the coater module 50. Thus, each has a width (denoted X in FIG. 11) that is equal to or less than ½ of the width of the coater module (denoted Y in FIG. 11). There are two coater module cable connectors 72 in the docking station 60 that connect to the electronic connectors 20 on the coater cart computers 16. These provide power for the power source charging circuit 46 and data transfer between the coater cart computer 16 and the coater module workstation computer 62. There is also wireless communication between these two computers as each has their own wireless communication devices 61 and 24. There are two fluid transfer hose connectors 74 in the docking station 60 that connects to the cart transfer connectors 55 on the carboys and facilitates the coater fluid to be pumped from the carboy.

In the docking station 60 there is also a coater fluid purge system. (See FIG. 11) This is a set of power operated valves that may be sequentially operated in a manner to flush the coater fluid feed lines 110 between fluid transfer hose connector 74 and the spray unit 66. The coater fluid purge system can purge the feed lines 110 with facility water 120 to the facility drain 140 and then purging the water in the fed lines 110 with facility compressed air 130 to the facility drain 140. (With optional piping connections, facility gases other than facility air 130 may be used to purge the water.

The coater fluid purge system 200 has a power operated water valve 122 and a power operated air valve 132 connecting the facility water 120 and facility compressed air 130, into fluid transfer hose connector 74. This is the first point the coater fluid enters the docking station 60. It has a power operated drain valve 67 that connects the spray unit 66 to the facility drain 140. In operation, when prompted, a line purge program from the coater module workstation computer 60 initiates the simultaneous opening of the water valve 122 and the drain valve 67. Water flows through the feed lines 110 from their beginning to their end and into facility drain 140. The computer 60 closes these two valves then opens the air valve 132 and the drain valve 67 to blow the water out of the feed lines 110. This process is repeated until the lines are clean and dry. After this valve manipulation, a different coater fluid may be used.

FIG. 1 presents a diagrammatic illustration of the semiconductor coater (fluid and data) docking station 60 and its integration with the coater module. The semiconductor coater fluid 2 arrives in bulk from the supplier and is fluidically transferred 4 (with or without the aid of a mechanical transfer mechanism) to the onsite bulk storage vessel 6. Along with the arrival of the coater fluid 2 there must be a transfer of pertinent data about the coater fluid from the supplier. (Presently, this generally arrives in the form of paper documents with the transportation manifests and the transport vehicle.)

This coater fluid data is made available at the bulk storage tank in either of three different ways with either of three data transfer means. It may be transferred via a scannable bar code 8 (card, placard or sticker media) provided by the manufacturer; by manual tactile input of manifest data from the supplier to the tactile data input interface (keyboard) 10 of the bulk storage vessel's localized computer 12; or by wireless communication and data transfer from a wireless communication device 14 provided by the coater fluid supplier (such as a passive or active RFID) to the storage tank's wireless communication device 15 (such as an a RFID reader at the onsite bulk storage tank 6) that receives and decodes the data and transmits it to the bulk storage vessel's localized computer 12.

In an fourth less favorable method of coater fluid data transfer, the coater fluid supplier may just leave its wireless communication device 14 (such as a passive or active RFID) at the storage tank where is can be read directly by the coater cart computer's wireless communication device 24 (transceiver) and input to the coater cart computer.

Once the coater fluid data has been transferred digitally into either the onsite bulk storage vessel's computer 12 or provided as a scannable digital code 8, it is transferred to a coater cart's computer 16 using either of three digital data acquisition means. The first embodiment digital data acquisition means is a physical (hard wire) connection between the coater cart computer's connector (socket 20) and the onsite storage vessel computer's connector (pin connector cable 22), so data is transferred to the coater cart computer 16 from the bulk storage vessel's localized computer 12. Although described herein as pin connectors, there are a plethora of other equivalent mechanical hard-wire configurations available. The coater cart's computer 16 has on board software that initiates the data transfer after a digital confirmation handshake with the vessel's localized computer 12.

The second embodiment digital data acquisition means, uses near field technology communication between the coater cart computer's wireless communication device 24 (transceiver) and the bulk storage vessel computer's wireless communication device 26 (transceiver) to transfer data between the two computers 12 and 16. These wireless transceivers may use any of the common wireless protocols such as RF, Wi-Fi or near field Bluetooth® (UHF radio waves in the ISM bands, from 2.402 GHz to 2.48 GHz) or ZigBee® (low-rate wireless personal area network (LR-WPAN) standard that is based on the IEEE 802.15) using UHF radio waves in the ISM bands, from 2.402 GHz to 2.48 GHz.

In the third embodiment digital data acquisition means, the coater cart 18 has a portable optical scanning device 28 operatively connected to the coater cart's computer 16 (either wirelessly or by hard wire as depicted). When within operating range, the barcode or QR code 8 is optically scanned, and the machine-readable optic image presents data or points to a location where the data can be retrieved. This is then downloaded to the coater cart's computer 16. The readable code 8 may be as simple as a sticker or placard placed on the bulk storage vessel 6, or it may be in paper form from the supplier that is made available at the vessel 6.

There is a fill connector 11 at the onsite bulk storage vessel 6 that is matingly engageable with the cart transfer connectors 55 on the coater cart 18. This enables coater fluid transfer between them whether pumped or by gravity feed. There is a level sensor 44 on the coater cart in communication (wireless or hard wired) with the coater cart computer 16 and provides it a continual signal of the coater fluid level in the carboy. The coater cart computer 16 has software enabled to alarm at high carboy levels and carboy leakage. There is also a visual carboy level indicator 47 on the top face of the carboy 36. (See FIGS. 2 and 3) When the carboy 36 is filled and disconnected from the fill connector 11 at the onsite bulk storage vessel 6, and after it has downloaded the coater cart fluid data into the coater cart's computer 16 from one of the three data acquisition means and its coater cart computer's connector 20 is disconnected from the onsite storage vessel computer's connector 22, the coater cart 18 may be rolled to the docking station 60, located directly below the coater spray unit 66. The coater cart 18 can be pushed into the docking station 60 until the side walls of its walled frame 34 contact the guide bumpers 70 that aid in aligning the docking of the two coater carts 18 under the spray unit.

Once in the docking station 60, the coater carts may be connected to the coater module cable connectors 72 and fluid transfer hose connector 74 for fluid transfer to the spray unit 66 and data transfer to the coater module's workstation computer 60. Once the coater cart's computer 16 is connected to the coater module's workstation computer the signal of the precise level of coater fluid in the carboy 36 at any time will be communicated to the coater module. This level may be used as fluid feed data, useable for coater spray analysis or to monitor the time to switch carboys. This carboy switch may be done manually or may be computerized with motorized valve versions of the fluid transfer hose connector 74 and or the cart transfer connectors 55.

Figure 12:
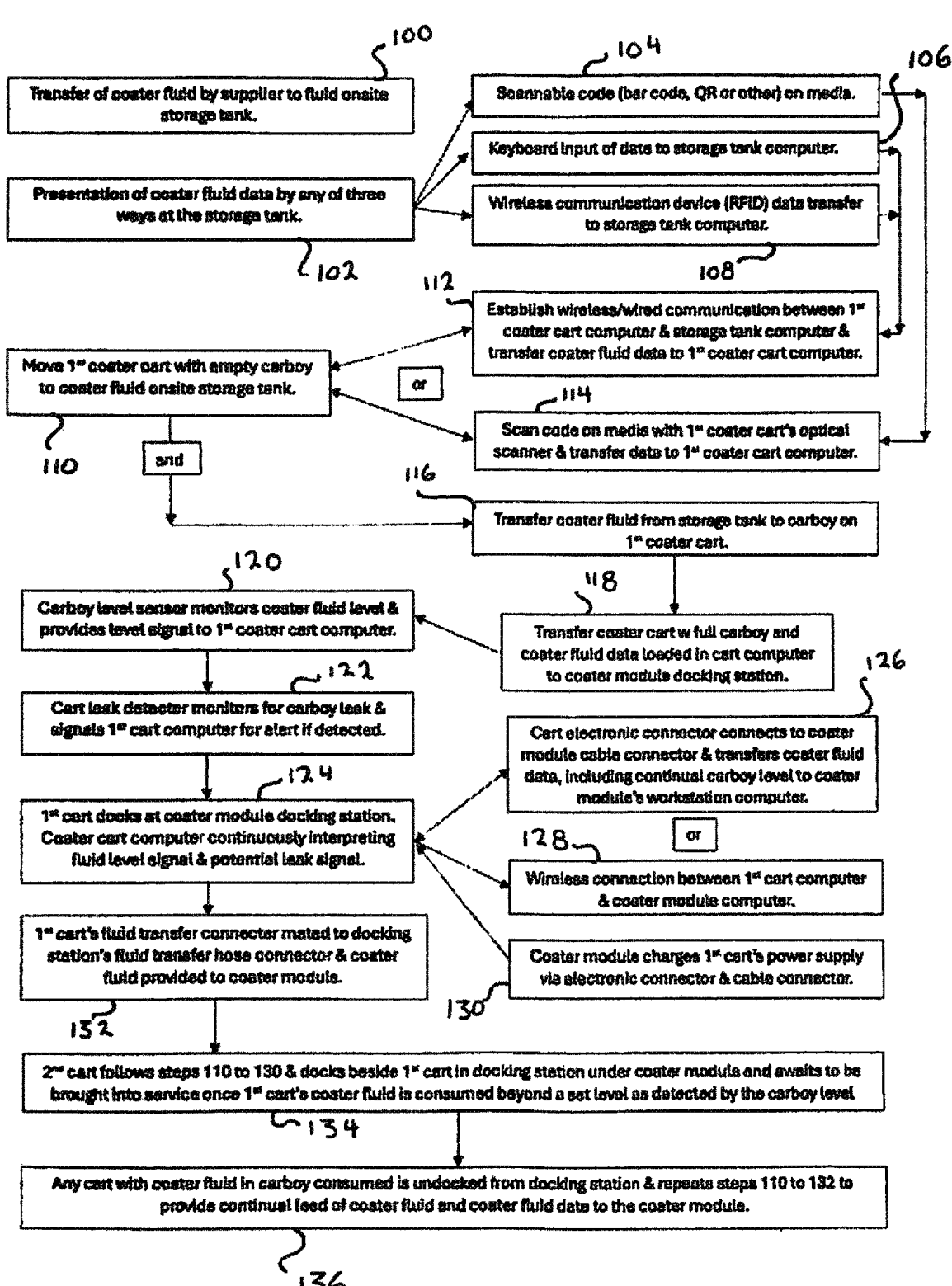
FIG. 12 is a process flow diagram of the method steps used to transfer coater fluid and coater fluid data between the onsite coater fluid bulk storage vessel and the coater module docking station.

FIG. 12 illustrates the method steps used to transfer coater fluid and coater fluid data between the onsite coater fluid bulk storage vessel and the coater module docking station. This process utilizes two coater carts to enable uninterrupted coater fluid supply. The supplier of the semiconductor coater fluid delivers a bulk shipment of coater fluid to the bulk onsite coater fluid storage tank. 100 At the same time the supplier also provides all of the pertinent data about the coater fluid to the storage tank unit 102. This includes information selected from the group consisting of data about the manufacturer of the coater fluid, the specific chemistry of the coater fluid, the manufacturer's batch identification of that coater fluid, the date of the receipt of the coater fluid, the coater fluid Material Safety Data Sheet, amount of coater fluid in the carboy, level coater fluid temperature, coater fluid pH, and coater fluid specific gravity.

The coater fluid data is transferred from the supplier to the storage tank unit in three different ways. 104, 106 108 Two of these ways, by manual input through the storage tank computer keyboard 106, and through a wireless communication device, such as an RFID chip, are directly transferred to the storage tank computer. 106 and 108 The third way, is by the presentation of a scannable code printed on media and deposited at the storage tank. 104. This scannable code may disseminate its data to the storage tank computer through an optical scanner connected to the storage tank computer. (This is not the preferred method as it requires an unnecessary intermediary for this type of data transfer. In the preferred method the code on media is just affixed to the storage tank or made available at that location to be scanned by a portable handheld scanner integrated with the cart computer 114 bypassing the storage tank computer.)

The first coater cart with an empty carboy is brought to the storage tank unit. 110 The carboy is filled with coater fluid from the storage tank by their mechanical fill connection. 116 (Note the carboy level is sensed by the level sensor and reported to the computer and there is a visual indication of the carboy level available on the carboy.) At the same time, the coater fluid data is transferred to the coater cart computer in either of two ways. The supplier's scannable code on media is scanned by the portable handheld optical scanner connected to the cart computer 114 or there is a wireless connection established between the coat cat computer and the storage tank computer. 112 (Note, at this time the carboy coater fluid level (amount) is updated to reflect the fill amount to the coater fluid data.) A third method of transfer would be by a hard wire connection between the two computers, however this method would not be preferred.

The coater cart with a carboy full of coater fluid and current coater fluid data loaded in the cart computer, is in route to the coater module docking station 118. Along the way, the cart is monitored for leakage of coater fluid by its leak detection system 122 and the instantaneous current carboy level is reported to the cart computer 120. The coater cart arrives at the coater module 124 and is docked there for fluid transfer 132 and provides available coater fluid to the coater module and transfers coater fluid data either wirelessly 128 or via hard wire cable connection to the coater module's workstation computer. 126 The coater module provides power to charge the coater cart's power supply. 130

With one coater cart docked, the second coater cart is brought to the storage tank and repeats the same transfer process between the storage tank and the transfer station of the coater module, repeating steps 110 to 130 Thereafter, any coater cart that has their coater fluid consumed below a preset level as determined by the level sensor, the cart computer and the coat module's workstation computer is undocked and repeats steps 110 to 130.

The importance of the semiconductor coater fluid transfer system is that it ensures the relevant data for the coater fluid follows it throughout its life cycle from delivery to spray coating, and it is transferred to all fabrication facility computers, host, workstation, cart or other. Using an extremely accurate traditional level sensor vs the conventional weight sensor, allows the determination of coater fluid levels in the carboy when it is away from the cart. This is useful for advance batch filling of the carboy 36. This system also lends itself to less wastage as it's level sensor 44 is a more sensitive device and can allow for the maximum coater fluid to be extracted from each carboy prior to any carboy rinse. The use of two coater carts allows a continual feed of coater fluid increasing operational time and supports two different types of coater fluids simultaneously which is useful with coater fluids of different viscosities used within the same process.

While certain features and aspects have been described with respect to exemplary embodiments, one skilled in the art will recognize that numerous modifications are possible. Moreover, while the procedures of the methods and processes for building, assembling and using the devices described herein are described in a particular order for ease of description, unless the context dictates otherwise, various procedures may be reordered, added, and/or omitted in accordance with various embodiments.

Consequently, in view of the wide variety of permutations to the embodiments described herein, this detailed description and accompanying material is intended to be illustrative only and should not be taken as limiting the scope of the inventive concept. What is claimed as the invention, therefore, is all such modifications as may come within the scope and spirit of the following claims and equivalents thereto.

The invention claimed is:

1. A method for the transfer of semiconductor wafer coater fluid and coat fluid data from a semiconductor processing facility's coater fluid bulk storage vessel to a semiconductor wafer spray coater module, comprising the steps of:

A) providing coater fluid data to said coater fluid bulk storage vessel in digital media form or as a scannable code on media, said coater fluid data selected from the group consisting of the manufacturer of the coater fluid, the specific chemistry of the coater fluid, the manufacturer's batch identification of that coater fluid, the date of the receipt of the coater fluid, the coater fluid Material Safety Data Sheet, the coater fluid temperature, the coater fluid pH, and the coater fluid specific gravity;

B) downloading said coater fluid data to a storage vessel computer;

C) providing a transportable first coater cart with a first carboy thereon to said coater fluid bulk storage vessel, said first coater cart having a first cart power supply, a first cart computer, a first data acquisition means and a first carboy level sensor;

D) filling said first carboy with coater fluid from said coater fluid bulk storage vessel;

E) downloading said coater fluid data to said first cart computer from said storage vessel computer;

F) providing a level signal from said first carboy level sensor to said first computer, said first computer determining a carboy level;

G) transferring said first coater cart from said bulk storage vessel to said wafer spray coater module;

H) docking said first coater cart at a docking station at said wafer spray coater module by connecting a first fluid transfer connector from said coater cart carboy to said wafer spray coater module and a hard wire connector from said first computer to a wafer spray coater module workstation computer;

I) uploading said coater fluid data and continual said carboy level data to said wafer spray coater module workstation computer;

J) providing a transportable second coater cart with a second carboy thereon to said coater fluid bulk storage vessel, said second coater cart having a second cart power supply, a second cart computer, a second data acquisition means and a second carboy level sensor; and repeating above steps d) to h) for said second coater cart.

2. The method of claim 1 wherein said first and said second cart computers have a digital data acquisition means selected from the group consisting of a wireless communication transceiver, an optical scanning device, and a first physical hard wire connector engageable between said cart computer and said onsite storage vessel's computer.

3. The method of claim 1 wherein said first cart and said second cart have a leak detection device in communication with said first and second cart computers.

4. The method of claim 1 wherein said first and said second level detection sensors are selected from the group consisting of optical, ultrasonic, ultrasound, radar, resistive, conductivity, or submersible level sensors.

5. The method of claim 1 comprising the additional step of charging said first cart power supply and said second cart power supply from said coater module.

6. A method for the transfer of semiconductor wafer coater fluid and coat fluid data from a semiconductor processing facility's coater fluid bulk storage vessel to a semiconductor wafer spray coater module, comprising the steps of:

A) providing a transportable first coater cart with a first carboy thereon to said coater fluid bulk storage vessel, said first coater cart having a first cart power supply, a first cart computer, a first data acquisition means and a first carboy level sensor;

B) providing coater fluid data from coater fluid supplier to said coater fluid bulk storage vessel in digital media form, said coater fluid data selected from the group consisting of the manufacturer of the coater fluid, the specific chemistry of the coater fluid, the manufacturer's batch identification of that coater fluid, the date of the receipt of the coater fluid, the coater fluid Material Safety Data Sheet, the coater fluid temperature, the coater fluid pH, and the coater fluid specific gravity;

C) downloading said coater fluid data to said coater fluid bulk storage vessel;

D) downloading said coater fluid data to said first cart computer from said storage vessel computer or from digital media provided by coater fluid supplier;

E) filling said first carboy with coater fluid from said coater fluid bulk storage vessel;

F) providing a level signal from said first carboy level sensor to said first computer, said first computer determining a carboy level;

G) transferring said first coater cart from said bulk storage vessel to said wafer spray coater module;

H) docking said first coater cart at a wafer coater spray module's docking station;

I) providing said coater fluid and said coat fluid data to said wafer spray coating module;

J) uploading said coater fluid data and continual said carboy level data to said wafer spray coater module workstation computer.

7. The method of claim 6 comprising the further step of repeating all step A) and C) to J) with a second coater cart, identical to said first coater cart.

* * * * *